(12) United States Patent
Hunt

(10) Patent No.: US 9,252,683 B2
(45) Date of Patent: Feb. 2, 2016

(54) TRACKING CONVERTERS WITH INPUT OUTPUT LINEARIZATION CONTROL

(71) Applicant: Cirasys, Inc., Dallas, TX (US)

(72) Inventor: Louis R. Hunt, Dallas, TX (US)

(73) Assignee: Cirasys, Inc., Dallas, TX (US)

( * ) Notice: Subject to any disclaimer, the term of this patent is extended or adjusted under 35 U.S.C. 154(b) by 271 days.

(21) Appl. No.: 13/938,333

(22) Filed: Jul. 10, 2013

(65) Prior Publication Data

US 2013/0301321 A1 Nov. 14, 2013

Related U.S. Application Data

(63) Continuation-in-part of application No. 13/373,673, filed on Nov. 22, 2011, now Pat. No. 8,803,498, which is a continuation-in-part of application No. 12/487,242, filed on Jun. 18, 2009, now Pat. No. 8,810,221.

(Continued)

(51) Int. Cl.
*H02M 7/5395* (2006.01)
*H02M 3/156* (2006.01)
(Continued)

(52) U.S. Cl.
CPC .............. *H02M 7/5395* (2013.01); *H02M 3/156* (2013.01); *H02M 3/1582* (2013.01); *H02M 3/158* (2013.01); *H02M 2001/009* (2013.01);
(Continued)

(58) Field of Classification Search
CPC ............. H02M 2001/0012; H02M 2001/0019; H02M 2001/0022; H02M 2001/0025; H02M 2001/009; H02M 3/156; H02M 3/157; H02M 3/1584; H02M 7/44; H02M 7/537; H02M 7/539; H02M 3/1582; H02M 7/5395
See application file for complete search history.

(56) References Cited

U.S. PATENT DOCUMENTS 4,630,187 A 12/1986 Henze
4,677,366 A 6/1987 Wilkinson et al.
(Continued)

FOREIGN PATENT DOCUMENTS

WO 2010148066 12/2010
WO 2012091850 7/2012

OTHER PUBLICATIONS

Hunt, L R., et al., "Global Transformations of Nonlinear Systems," IEEE Transactions on Automatic Control, Jan. 1983, 24-31, vol. 28 No. 1.

(Continued)

*Primary Examiner* — Fred E Finch, III
(74) *Attorney, Agent, or Firm* — Schultz & Associates, P.C.

(57) ABSTRACT

In a preferred embodiment, a voltage inverter comprises a voltage converter circuit and a controller. The voltage inverter produces a time-varying output voltage from an input voltage, which can be a DC input voltage or an AC input voltage. The controller provides a control signal at a duty ratio determined dynamically by a set of signals. The set of signals include the time-varying output voltage, a predetermined output voltage, a gain factor and an inductor current in the voltage converter circuit. The predetermined output voltage can have an AC waveform or an arbitrary time-varying waveform. The voltage inverter operates to match the time-varying output voltage to the predetermined output voltage. Input-output linearization is used to design a buck inverter, and input-output linearization with leading edge modulation is used to design boost and buck-boost inverters under conditions where left half plane zero effects are present.

30 Claims, 7 Drawing Sheets

Related U.S. Application Data

(60) Provisional application No. 61/670,520, filed on Jul. 11, 2012, provisional application No. 61/458,850, filed on Dec. 2, 2010.

(51) Int. Cl.
  *H02M 3/158* (2006.01)
  *H02M 1/00* (2007.01)
  *H03K 7/08* (2006.01)

(52) U.S. Cl.
  CPC ......... *H02M 2001/0012* (2013.01); *H03K 7/08* (2013.01)

(56) References Cited

U.S. PATENT DOCUMENTS

| | | | |
|---|---|---|---|
| 4,929,882 | A | 5/1990 | Szepesi |
| 5,138,250 | A | 8/1992 | Capel |
| 5,311,421 | A | 5/1994 | Nomura et al. |
| 5,442,534 | A | 8/1995 | Cuk et al. |
| 5,477,132 | A | 12/1995 | Canter et al. |
| 5,708,433 | A | 1/1998 | Craven |
| 5,804,950 | A | 9/1998 | Hwang et al. |
| 5,886,586 | A | 3/1999 | Lai et al. |
| 5,920,471 | A | 7/1999 | Rajagopalan et al. |
| 5,943,224 | A | 8/1999 | Mao |
| 6,084,450 | A | 7/2000 | Smith et al. |
| 6,366,070 | B1 | 4/2002 | Cooke et al. |
| 6,407,515 | B1 | 6/2002 | Hesler et al. |
| 6,462,962 | B1 | 10/2002 | Cuk |
| 6,538,905 | B2 | 3/2003 | Greenfield et al. |
| 6,545,887 | B2 | 4/2003 | Smedley et al. |
| 6,674,272 | B2 | 1/2004 | Hwang |
| 6,956,360 | B2 | 10/2005 | Matsuura et al. |
| 7,103,425 | B1 | 9/2006 | Marra, III et al. |
| 7,239,257 | B1 | 7/2007 | Alexander et al. |
| 7,482,794 | B2 | 1/2009 | Hunt et al. |
| 7,489,186 | B2 | 2/2009 | Segarra |
| 7,602,166 | B1 | 10/2009 | Kang |
| 7,812,586 | B2 | 10/2010 | Soldano et al. |
| 7,851,941 | B2 | 12/2010 | Walley |
| 8,130,522 | B2 | 3/2012 | Maksimovic |
| 8,674,674 | B1 * | 3/2014 | Abu Qahouq ............ 323/283 |
| 2001/0030879 | A1 | 10/2001 | Greenfeld et al. |
| 2003/0090253 | A1 | 5/2003 | Balakrishnan |
| 2003/0199997 | A1 | 10/2003 | Gao |
| 2003/0222627 | A1 | 12/2003 | Hwang |
| 2005/0068001 | A1 * | 3/2005 | Skaug et al. ............ 318/807 |
| 2005/0231133 | A1 * | 10/2005 | Lys ............ 315/291 |
| 2006/0158910 | A1 | 7/2006 | Hunt et al. |
| 2006/0171182 | A1 * | 8/2006 | Siri et al. ............ 363/131 |
| 2007/0046105 | A1 | 3/2007 | Johnson et al. |
| 2007/0114985 | A1 * | 5/2007 | Latham et al. ............ 323/283 |
| 2007/0236200 | A1 | 10/2007 | Canfield et al. |
| 2008/0100362 | A1 * | 5/2008 | Gizara ............ 327/175 |
| 2008/0231115 | A1 * | 9/2008 | Cho et al. ............ 307/41 |
| 2010/0141225 | A1 | 6/2010 | Isham et al. |
| 2010/0164282 | A1 | 7/2010 | Tseng et al. |
| 2010/0308026 | A1 * | 12/2010 | Vogel ............ 219/130.21 |
| 2010/0320978 | A1 | 12/2010 | Hunt et al. |
| 2012/0146596 | A1 | 6/2012 | Lin et al. |
| 2013/0181690 | A1 * | 7/2013 | Holloway ............ 323/234 |
| 2013/0241513 | A1 * | 9/2013 | Trautmann ............ 323/283 |
| 2013/0301321 | A1 | 11/2013 | Hunt |

OTHER PUBLICATIONS

Ma, D., et al., "Enabling Power-Efficient DVFS Operations in Silicon," IEEE Circuits and Systems Magazine, First Quarter, 2010, 14-30.
Meyer, G., et al., "Nonlinear System Guidance in the Presence of Transmission Zero Dynamics," NASA Technical Memorandum 4661, Jan. 1995.
Middlebrook, R., et al., "A General Unified Approach to Modeling Switch-Converter Power Stages," IEEE Power Electronics Specialists Conference Record, Jun. 1976, 73-86.
Ridley, Ray, "11 Ways to Generate Multiple Outputs," Switching Power Magazine, 2005, 1-12.
Sable, Dan M., et al., "Elimination of the Positive Zero in Fixed Frequency Boost and Flyback Converters," Proceedings of 5th IEEE Applied Power Electronics Conference, 1990, 205-211.
Taylor, Robert J., "Feedback Linearization of Fixed Frequency PWM Converters," Ph.D. Dissertation, University of Texas at Dallas, Nov. 2005.
Slotine, et al., "Applied Nonlinear Control," Prentice-Hall, Inc., Englewood Cliffs, 1991.
Su, R., "On the Linear Equivalents of Nonlinear Systems," Systems and Control Letters 2, (1982), 48-52.
Su, et al., "Linear EqUivalents of Nonlinear Time-Varying Systems," International Symposium on Mathematical Theory of Networks and Systems (1981), 119-123.
Su, et al., "Robustness in Nonlinear Control," Differential Geometric Control Theory, Birkhauser, Boston, R. W. Brockett, R. S. Millman, and H. J. Sussman, Eds., (1983), 316-337.
Tang, Wei, "Average Current-Mode Control and Charge Control for PWM Converters," Ph. D. Dissertation, Virginia Polytechnic Institute and State University (1994).
Bodson, et al., "Differential-Geometric Methods for Control of Electric Motors," Int. J. of Robust and Nonlinear Control 8, (1998), pp. 923-954.
Ćuk, "Modelling, Analysis, and Design of Switching Converters," Dissertation, California Institute of Technology (1977), 317 pages.
Deisch, C.W., "Simple Switching Control Method Changes Power Converter into a Current Source," IEEE Power Electronics Specialists Conference, 1978 Record, pp. 300-306.
Hunt, et al., "Design for Multi-Input Nonlinear Systems," Differential Geometric Control Theory, Birkhauser, Boston, R. W. Brockett, R. S. Millman, and H. J. Sussman, Eds., (1983), 268-298.
Isidori, A. "Nonlinear Control Systems," 3rd Ed, Springer-Verlag London Limited (1995).
Meyer, et al., "Applications of Nonlinear Transformations to Automatic Flight Control," Automatica, 20 (1984), 103-107.
Mitchell, D. M., "DC-DC Switching Regulator Analysis, Reprint Edition," D.M. Mitchell Consultants, McGraw-Hill, Inc. (1988).
Ridley, "A New Small-Signal Model for Current-Mode Control," Ph. D. Dissertation, Virginia Polytechnic Institute and State University (1990) 15 pages.
Sanders, "Nonlinear Control of Switching Power Converters," Ph.D. Dissertation, Massachusetts Institute of Technology (1989) 254 pages.
Shortt, Daniel J., "An Improved Switching Converter Model," Ph.D. Dissertation, Virginia Polytechnic Institute and State University (1982).
Sira-Ramirez, et al., "Exact Linearization in Switched Mode DC-to-DC Power Converters," Int. J. Control, 50 (1989), pp. 511-524.
Sira-Ramirez, "Switched Control of Bilinear Converters Via Pseudolinearization," IEEE Transactions on Circuits and Systems, vol. 36, No. 6, Jun. 1989, 8 pages.
Taylor, Robert J., "Feedback Linearization of Fixed Frequency PWM Converters," Revised Ph.D. Dissertation, University of Texas at Dallas, (undated), 174 pages.

\* cited by examiner

US 9,252,683 B2

TRACKING CONVERTERS WITH INPUT OUTPUT LINEARIZATION CONTROL

CROSS-REFERENCE TO RELATED APPLICATIONS

This application claims priority benefit from U.S. Provisional Application No. 61/670,520 filed Jul. 11, 2012. This application is a continuation-in-part of U.S. patent application Ser. No. 13/373,673 filed Nov. 22, 2011, which further claims priority benefit to U.S. Provisional Application No. 61/458,850 filed Dec. 2, 2010, which also is a continuation-in-part of U.S. patent application Ser. No. 12/487,242 filed Jun. 18, 2009.

FIELD OF THE INVENTION

The present invention relates generally to providing modulation signals to electrical circuits and, more particularly, to tracking inverters and tracking converters based on input-output linearization control.

BACKGROUND OF THE INVENTION

Power converters are used to convert one form of energy to another (e.g., AC to AC, AC to DC, DC to AC, and DC to DC) thereby making it usable to the end equipment, such as computers, automobiles, electronics, telecommunications, space systems and satellites, and motors. Every application of power electronics involves some aspect of control. Converters are typically identified by their capability and/or configurations, such as, buck converters, boost converters, buck-boost converters, boost-buck converters (Ćuk), etc. These converters can belong to a family of converters known as "switching regulators" (DC-DC conversion), "switching converters", or "switching inverters" (DC-AC conversion) depending upon their configuration. Switching converters are generally efficient because the conversion elements switch from one state to another, rather than needlessly dissipating power during the conversion process. Essentially there is a converter circuit including a set of switches and at least two configurations of the converter, according to the states of the set of switches. Each configuration can be modeled as linear system. The duty ratio (d) is the ratio indicating the time in while one switch is in the "on" position and another switch is in the "off" position: this d is considered to be the control input. Control input d is usually driven by pulse-width-modulation ("PWM") techniques.

Switching from one state to another during operation and the accompanying nonlinearity of power converters creates transient problems. State space averaging reduces the transient problems to make the system, in general, a nonlinear averaged system for a boost converter or a buck-boost converter. But, control of the system under these nonlinear effects becomes difficult when certain performance objectives must be met. Linearization is mostly accomplished through a Taylor series expansion. Nonlinear terms of higher orders are thrown away and a linear approximation replaces the nonlinear system. This linearization method has proven effective for stabilizing control loops at a specific operating point. However, use of this method requires making several assumptions, one of them being so-called "small signal operation." This works well for asymptotic stability in the neighborhood of the operating point, but ignores large signal effects which can result in nonlinear operation of the control loop when, for example, an amplifier saturates during startup, or during transient modes, such as load or input voltage changes. Once nonlinear operation sets in, the control loop can have equilibrium points unaccounted for in the linearization.

One of the most widely used methods of pulse-width modulation is trailing-edge modulation ("TEM"), wherein the on-time pulse begins on the clock and terminates in accordance with a control law. Unstable zero dynamics associated with TEM with switch on-time sampling in the continuous conduction mode ("CCM") prevent the use of an input-output feedback linearization because it would result in an unstable operating point for boost and buck-boost converters. The other modulation method is LEM, wherein the on-time pulse begins in accordance with a control law and terminates on the clock. The difference between LEM and TEM is that in TEM the pulse-width is determined by the instantaneous control voltage $v_c$ prior to switch turn-off, whereas in LEM the pulse-width is determined by $v_c$ prior to switch turn-on.

Further, it is known in the art that pulse-width modulation ("PWM") of boost and buck-boost power converters exhibit right half plane zero effects when trailing edge modulation with on time switch sampling is employed. This makes control design extremely difficult. It has been shown that if leading edge modulation or trailing edge modulation with off time switch sampling is used with a sufficiently large equivalent series resistance ("ESR") $R_c$ of the output capacitor, then left half plane zero effects emerge.

Therefore, there is a need for a system and method for tracking inverters and general tracking converters with off-time sampling and either LEM or TEM control.

SUMMARY OF THE INVENTION

Disclosed is a voltage inverter comprising a voltage converter circuit and a controller. The voltage inverter produces a time-varying output voltage from an input voltage, where the input voltage can be a DC voltage, an AC input voltage at a given input frequency or a time-varying voltage signal having a given input frequency spectrum.

The controller provides a control signal at a duty ratio determined dynamically by a set of signals. The set of signals include the time-varying output voltage, a predetermined output voltage, a gain factor and an inductor current in the voltage converter circuit. The predetermined output voltage can have an output AC waveform or an arbitrary time-varying waveform. The output AC waveform can have an output frequency different than the input frequency. The arbitrary time-varying waveform can have an output frequency spectrum different than the input frequency spectrum.

The voltage inverter operates to match the time-varying output voltage to the predetermined output voltage. Input-output linearization is used to design various inverters under conditions where left half plane zero effects are present.

In an embodiment of a buck inverter, a time-varying duty cycle for the control signal is derived for a voltage inverter where the voltage converter circuit is a buck converter circuit.

In an embodiment of a boost inverter, a time-varying duty cycle for the control signal is derived for a voltage inverter where the voltage converter circuit is a boost converter circuit and leading edge modulation is used.

In an embodiment of a buck-boost inverter, a time-varying duty cycle for the control signal is derived for a voltage inverter where the voltage converter circuit is a buck-boost converter circuit and leading edge modulation is used.

Detailed disclosure of these and other aspects are provided in the detailed description that follows.

DETAILED DESCRIPTION

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use the invention and do not delimit the scope of the invention.

The present disclosure provides a method and apparatus for controlling a voltage converter circuit to realize a power inverter. A power inverter in power electronics usually refers to a power converter device that delivers an ac output voltage in response to a dc input voltage. More generally, the present disclosure delivers an arbitrary time-varying output waveform for one of either a dc voltage input or an ac voltage input. In particular, the present disclosure uses input-output linearization to compute a duty ratio for control feedback of a voltage converter. Embodiments for a buck converter, a boost converter and a buck-boost converter are disclosed, where the boost and buck-boost converters use off-time sampling with either leading edge modulation or trailing edge modulation. The resulting control system can also be applied to other converter types. Moreover, the parameters in the control system are programmable, and hence the algorithm can be easily implemented on a DSP or in silicon, such as an ASIC.

In general, buck, boost, and buck-boost converter circuits are characterized by state equations for state variables $x_1$ (inductor current), $x_2$ (capacitor voltage) and y (output voltage). A control signal is applied to a primary switch ($S_1$) characterized by its instantaneous duty ratio d. For DC-DC converters, the steady-state output voltage of a boost voltage converter is $1/(1-D)$ times the input voltage where D is the steady-state value of the instantaneous duty ratio d. The steady-state output voltage of a buck-boost converter is $D/(1-D)$ times the input voltage and the steady-state output voltage of a buck converter is D times the input voltage. For a voltage converter with time-varying output voltage, y(t) and the resultant duty ratio d(t) also varies with time.

Figure 1:
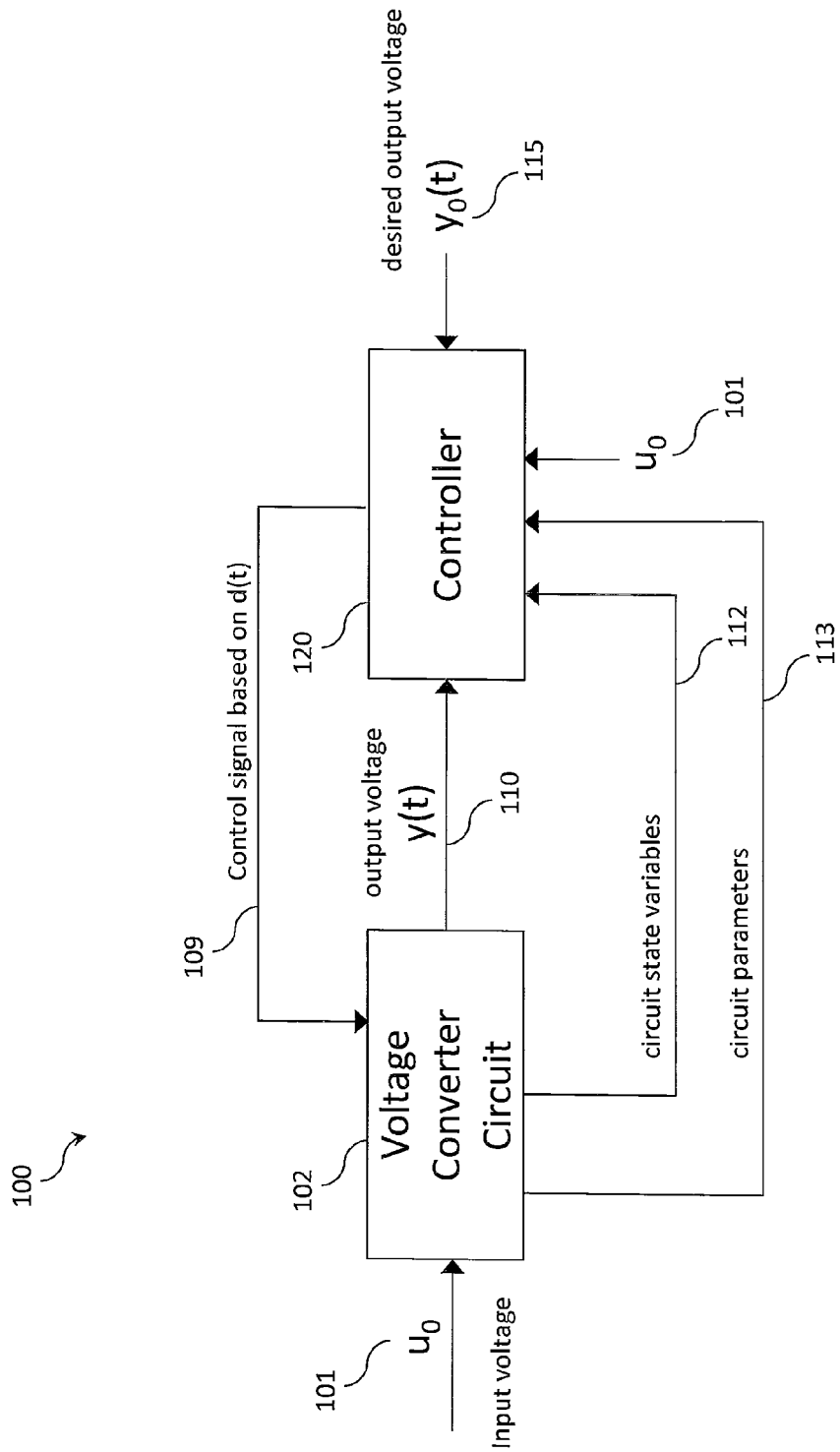
FIG. 1 is a block diagram of a preferred embodiment of a tracking inverter including a voltage converter circuit and a controller.

FIG. 1 shows a preferred embodiment of a tracking inverter 100 suitable for controlling a voltage converter circuit to produce a time varying output voltage. Tracking inverter 100 is amenable to input-output linearization methods that do not constrain stability to one operating point, but rather to a set of operating points spanning the expected range of operation during startup and transient modes of operation. A voltage converter circuit 102 is connected to an input voltage 101 ($u_0$) and produces output voltage 110, y(t), in response to a control signal 109 characterized by the duty ratio d(t). In a preferred embodiment, output voltage 110 is a time varying waveform intended to match a desired output voltage 115, $y_0(t)$, also time varying. Controller 120 produces control signal 109 from sensing output voltage 110, input voltage 101, desired output voltage 115, a set of static circuit parameters 113 including, for example, the load resistance R, the capacitance C and the inductance L, and a set of state variables 112 including, for example, inductor current $x_1$ and capacitor voltage $x_2$. Control signal 109 determines the states of a set of switches internal to voltage converter circuit 102.

Controller 120 is preferably implemented in one or more digital devices, implemented with programmable software instructions stored in memory and executed by a processor to carry out the converter control functions including output adjustment. In alternate embodiments, an analog implementation is used instead of a digital implementation. The controller methods as described below are then implemented as hardware functions, including analog adders and multipliers.

Controller 120 can implement any desired control method. For example, a pulse width modulated (PWM) controller is suitably constructed. The PWM controller produces a time varying control signal which drives the primary switch ($S_1$) of a voltage converter with the duty ratio d.

Examples of voltage converter circuit 102 include a buck converter, a boost converter and a buck-boost converter. Voltage converters operating in the continuous conduction mode with trailing edge modulation (TEM) and switch on-time sampling give rise to unstable zero dynamics for boost and buck-boost converters where the linear segment of the system about an operating point has a right half plane zero. In a preferred control embodiment, leading-edge modulation (LEM) with switch-off time sampling is implemented by controller 120 that changes the zero dynamics, so that the linear part of the system has only left half plane zeros. In an alternate embodiment, trailing-edge modulation (TEM) with switch-off time sampling is implemented. Since the resulting nonlinear system possesses stable zero dynamics, input-output feedback linearization can be employed wherein a linearizing transformation is performed and used to define control signal inputs to a converter. The control signal duty ratios and resulting zero dynamics for boost and buck-boost converters are the same for both LEM and TEM with switch-off time sampling.

A buck converter is a linear system which has a left half plane zero in its transfer function, therefore, input-output linearization can always be employed, regardless of the modulation method used.

An inverter in power electronics usually refers to a power converter device delivering a sinusoidal AC output voltage in response to a DC input voltage. In the embodiments disclosed below, voltage converters that have general bounded time functions, not just sinusoidal waveforms, as the desired output voltages. These converters will be known as tracking inverters. The tracking inverter supports a steady state tracking inversion, which is the process of establishing a control signal d(t) so that the output voltage y(t) converges to the desired output voltage $y_0(t)$ as time, t, goes to infinity. Tracking inverters, based on buck, boost and buck-boost converters, are analyzed using their respective Cuk-Middlebrook two dimensional state space averaged models.

Figure 2A:
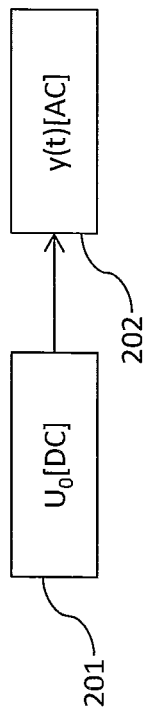
FIG. 2A is a block diagram of a tracking inverter producing an AC output from a DC input.

Referring to FIG. 2A, in a first embodiment of a tracking inverter, a DC-AC tracking inverter converts a DC input voltage 201 to an AC output voltage 202 varying with time in a sinusoidal function.

Figure 2B:
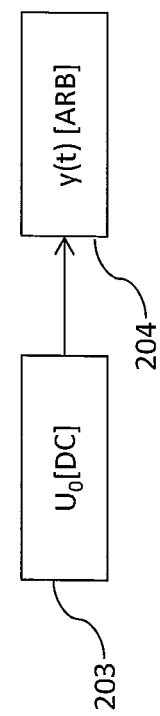
FIG. 2B is a block diagram of a tracking inverter producing an arbitrary output waveform from a DC input.

Referring to FIG. 2B, in a second embodiment of a tracking inverter, a tracking inverter function converts a DC input voltage 203 to an arbitrary time-varying output voltage 204 having an arbitrary waveform and arbitrary frequency spectrum.

Figure 2C:
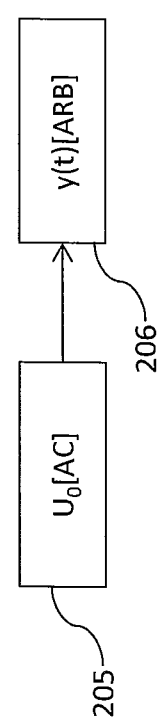
FIG. 2C is a block diagram of a tracking inverter producing an arbitrary output waveform from an AC input.

Referring to FIG. 2C, in a third embodiment of a tracking inverter, a tracking inverter converts an AC input voltage 205 to an arbitrary time-varying output voltage 206. Further to FIG. 6C, the input voltage $u_0$ may have an input waveform characterized by an input frequency while the output voltage y(t) may have an output waveform characterized by an output frequency. The output waveform can be different than the input waveform and the output frequency can be different than the input frequency. Moreover, the output frequency spectrum can be different that the input frequency spectrum for more complex waveforms.

A theory of steady state tracking inversion is disclosed as follows. Voltage converter circuit 102 is characterized by a simple two dimensional linear system $$\dot{y} = a_{11}y + a_{12}x_1 + b_1 d$$

$$\dot{x} = a_{21}y + a_{22}x_1 + b_2 d \qquad \text{Eq. 1}$$

$$y = y$$

for state variables $x_1$, output voltage y and control signal duty ratio d. It is assumed that the transfer function of Eq. 1 has no pole zero cancellations. The zero z of the transfer function is found by setting the determinant of the matrix $$\begin{bmatrix} sI - A & b \\ -c & 0 \end{bmatrix} \qquad \text{Eq. 2}$$

equal to zero and solving for s, with $$A = \begin{bmatrix} a_{11} & a_{12} \\ a_{21} & a_{22} \end{bmatrix}, b = \begin{bmatrix} b_1 \\ b_2 \end{bmatrix}, \text{ and } c = [1 \ 0].$$

The solution for the zero z is $$z = a_{22} - \frac{a_{12}b_2}{b_1} \qquad \text{Eq. 3}$$

Assume $y_0(t)$ is bounded with bounded derivative $\dot{y}_0(t)$ on $[0,\infty)$. Substituting $y_0$ for y in Eq. 1, solving for $d_0$, the desired control signal to produce the desired output is $$d_0 = \frac{\dot{y}_0 - a_{11}y_0 - a_{12}x_1}{b_1} \qquad \text{Eq. 4}$$

Substituting $d_0$ from Eq. 4 and $y=y_0$ into the second equation of Eq. 1, the following result is obtained:

$$\dot{x}_1 = \left(a_{22} - \frac{a_{12}b_2}{b_1}\right)x_1 + \left(a_{21} - \frac{a_{11}b_2}{b_1}\right)y_0 + \frac{b_2}{b_1}\dot{y}_0 \qquad \text{Eq. 5}$$

The characteristic root of this first order nonhomogeneous constant coefficient differential solution is $$z = a_{22} - \frac{a_{12}b_2}{b_1},$$

the zero of the transfer function of the original system. The general solution with arbitrary constant $c_1$ of the nonhomogeneous equation is $$c_1 e^{zt} + x_{1p} \qquad \text{Eq. 6}$$

where $x_{1p}$ is a particular solution of the nonhomogeneous Eq. 1. Assuming that the zero of the system is in the open left plane, i.e. z<0, all solutions converge to a unique particular solution $x_{10}$ as time t goes to infinity.

Proportional output feedback is added and the term $a_{11}y_0$ is replaced by $a_{11}y$ in Eq. 4 to form the feedback control signal with time varying duty ratio d(t) defined by $$d(t) = \frac{\dot{y}_0 - k(y - y_0) - a_{11}y - a_{12}x_1}{b_1} \qquad \text{Eq. 7}$$

where k>0. In another embodiment, integral and derivative gain can also be used to derive d(t). Substituting Eq. 7 into Eq. 1, the following error equations for $\Delta y = (y - y_0)$ and $\Delta x = (x_1 - x_{10})$ are derived as:

$$\Delta \dot{y} = -k\Delta y \qquad \text{Eq. 8}$$

$$\Delta \dot{x} = -\frac{b_2}{b_1}\Delta \dot{y}_0 + \left(a_{21} - \frac{a_{11}b_2}{b_1}\right)\Delta y + \left(a_{22} - \frac{a_{12}b_2}{b_1}\right)\Delta x$$

Eqs. 5-8 show that all solutions (y; $x_1$) tend exponentially to ($y_0$; $x_{10}$) as time t goes to infinity. In particular, y(t) converges to $y_0(t)$ as time t goes to infinity which means that steady state tracking inversion is achieved. A time varying desired output voltage $y_0(t)$ is easily handled by the controller by utilizing the desired output voltage and its derivative, $y_0(t)$ and $\dot{y}_0(t)$ as shown in Eq. 7, computing d Wand applying the feedback control signal with d(t) to the voltage converter circuit.

Figure 3:
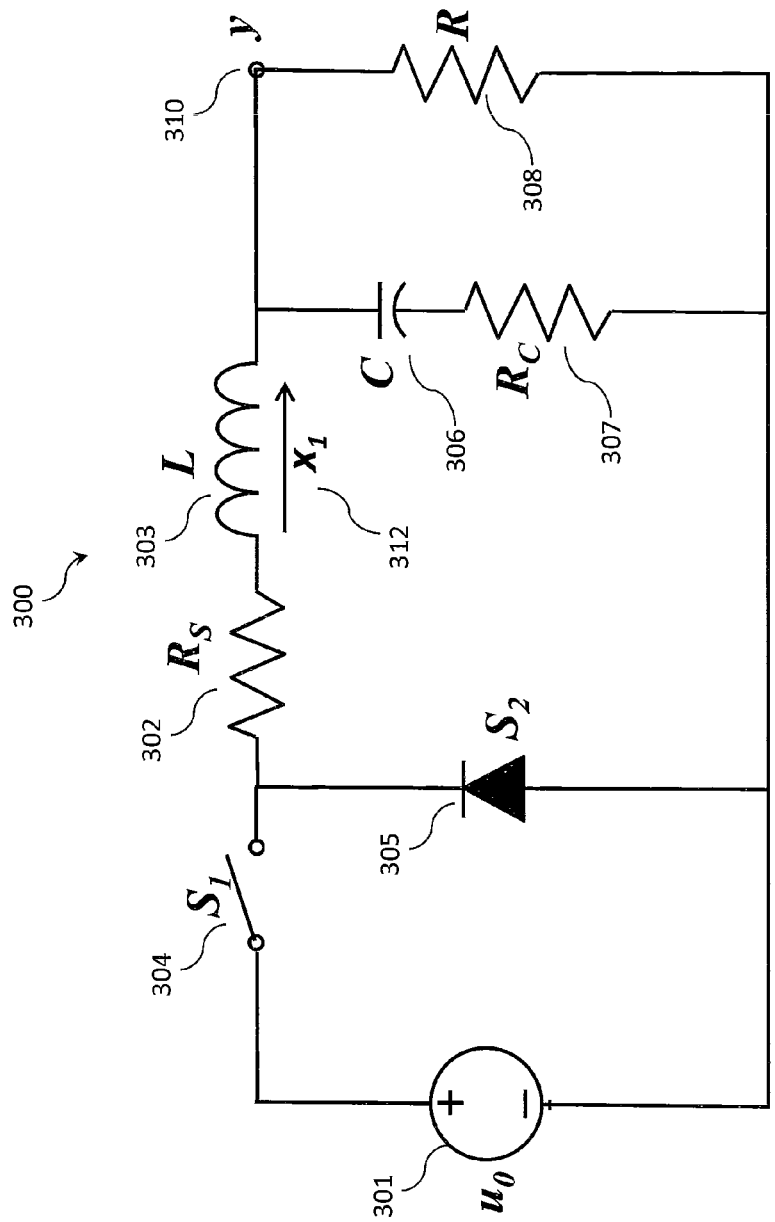
FIG. 3 is a circuit diagram of a buck converter of a preferred embodiment.

FIG. 3 illustrates a preferred embodiment buck converter circuit 300 having a single output voltage 310 (y). The buck converter comprises a switch 304 ($S_1$) connected in series with a series resistor 302 ($R_S$) connected to inductor 303 (L) which is further connected to load resistance 308 (R). Switch 304 and load resistance 308 further connect to DC voltage input 301 ($u_0$) to complete a series circuit. A switch 305 ($S_2$) is connected between switch 304 and DC voltage input 301. A capacitive circuit is connected in parallel with load resistance 308 and comprises a capacitor 306 (C) connected to a DC series resistance 307 ($R_C$) associated with capacitor 306. The output voltage 310 is taken across load resistance 308, is non-negative and is less than DC voltage input 301. The inductor current 312 ($x_1$) is measured as the current through inductor 303 and series resistor 302.

In a preferred embodiment of a buck inverter, buck converter circuit 300 is substituted for voltage converter circuit 102, and controller 120. The DC voltage input $u_0$ is a constant and the desired output voltage $y_0(t)$ is a cosine function. More generally, the desired output voltage $y_0(t)$ is not just a sinusoidal function, but together with its time derivative, are general functions that are bounded on [0, ∞). A switch matrix is employed by the controller to handle the positive, zero, and negative values of $u_0$, $y_0$ and y as required to set the duty ratio.

For the buck converter circuit, the matrix A characterizing the state equation Eq. 2 assumes the values:

$$a_{11} = -\frac{R_C R}{R + R_C}\left(\frac{1}{L} + \frac{1}{RR_C C}\right)$$ Eq. 9

$$a_{12} = \frac{R_C R}{R + R_C}\left(-\frac{R_S}{L} + \frac{1}{R_C C}\right)$$

$$a_{21} = -\frac{1}{L}$$

$$a_{22} = -\frac{R_S}{L}.$$

The matrix b assumes the values:

$$b_1 = \frac{R_C R u_0}{(R + R_C)L}$$ Eq. 10

$$b_2 = \frac{u_0}{L},$$

and $$c = [1\ 0].$$

The zero of the transfer function is $-1/(R_C C)$, which is in the open left half plane. The values in Eq. 9 and Eq. 10 are substituted into Eq. 7 resulting in the formula:

$$d(t) = \frac{\dot{y}_0 - k(y - y_0) - a_{11}y - a_{12}x_1}{b_1}$$ Eq. 11 which is continuously computed, for the desired voltage $y_0(t)$ and the output voltage y, and applied by the controller of FIG. 1 to the buck converter circuit of FIG. 3. When the controller implements Eq. 11, y(t) converges to $y_0(t)$, d(t) converges to a steady-state function $D_0(t)$ as t goes to infinity and steady-state tracking is achieved for the buck inverter. A time varying desired output voltage $y_0(t)$ is easily handled by the controller by utilizing the desired output voltage and its derivative, $y_0(t)$ and $\dot{y}_0(t)$ as shown in Eq. 11, computing d(t) and applying the feedback control signal with d(t) to the voltage converter circuit.

In an alternate embodiment, $u_0$ is a time varying function bounded on $[0, \infty)$ and the equations 9, 10 and 11 are adjusted accordingly to derive the duty ratio d(t) and produce the desired output voltage $y = y_0(t)$.

Figure 4:
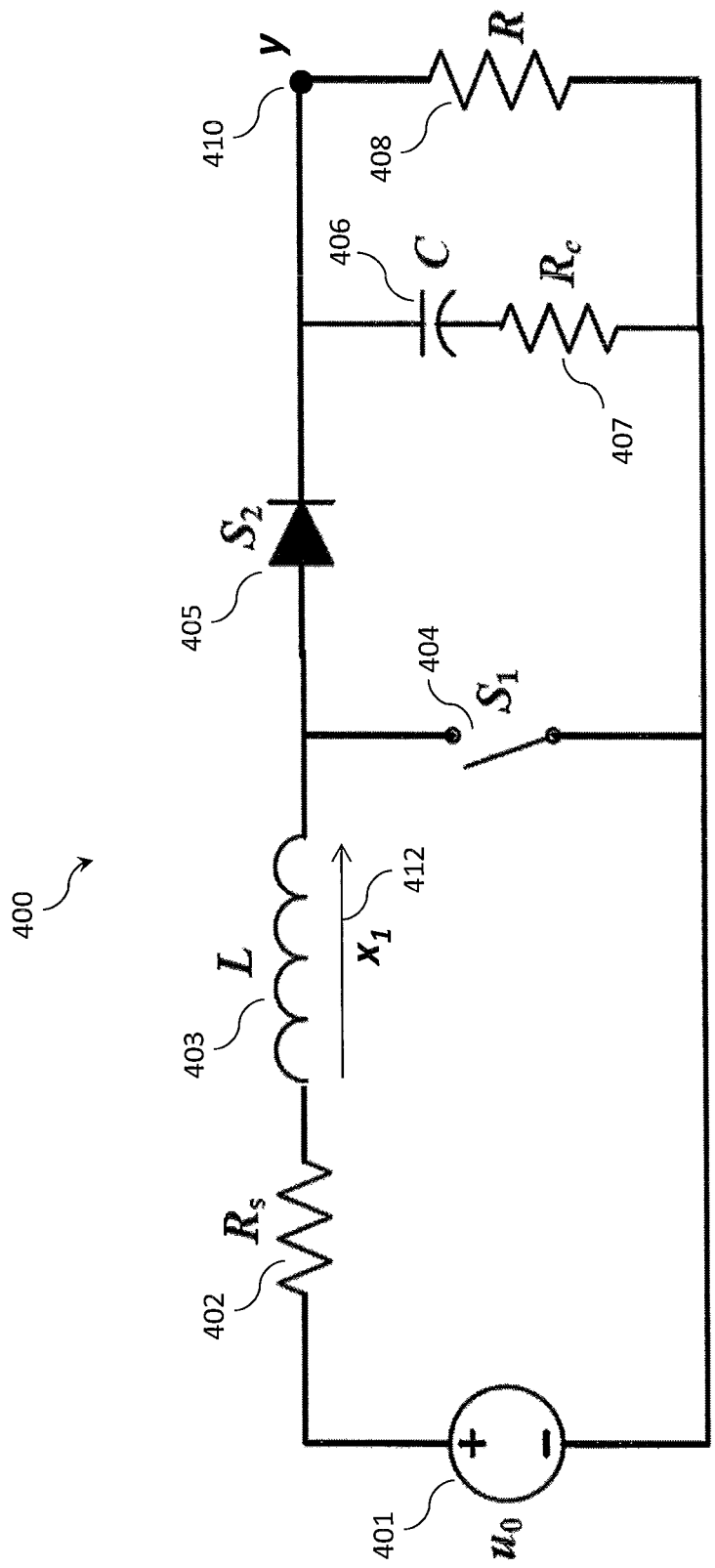
FIG. 4 is a circuit diagram of a boost converter of a preferred embodiment.

FIG. 4 illustrates a preferred embodiment boost converter circuit 400 having a single output voltage 410 (y). The boost converter comprises a series resistor 402 ($R_s$) connected in series with an inductor 403 (L), a switch 404 ($S_1$) and a DC voltage input 401 ($u_0$). A capacitive circuit comprises a switch 405 ($S_2$), connected in series to inductor 403, further connected in series to a capacitor 406 (C) and DC series resistance 407 ($R_C$) associated with capacitor 406. Load resistance 408 (R) is connected in parallel with capacitor 406 and DC series resistance 407. Output voltage 410 is taken across load resistance 408. The inductor current 412 ($x_1$) is measured as the current through inductor 403 and series resistor 402.

In a preferred embodiment of a boost inverter, boost converter circuit 400 is substituted for voltage converter circuit 102, and controller 120 uses LEM with switch off time sampling of the state variables. The DC voltage input $u_0$ is a constant and the desired output voltage $y_0(t)$ is a cosine function. More generally, the desired output voltage $y_0(t)$ is not just a sinusoidal function, but together with its time derivative, are general functions that are bounded on $[0, \infty)$. A switch matrix is employed by the controller to handle the positive, zero, and negative values of $u_0$, $y_0$ and y as required to set the duty ratio.

The state equations for y and $x_1$ for the boost converter under nonlinear Cuk-Middlebrook averaging with LEM and switch-off time sampling are:

$$\dot{y} = \frac{1}{(R + R_C)LC}\left[\begin{array}{l}-(RR_C C + L)y + (L - R_S R_C C)Rx_1 + \\ RR_C Cu_0 + R\left(R_C Cy - \frac{LR}{(R + R_C)}x_1\right)d\end{array}\right]$$ Eq. 12

$$\dot{x}_1 = -\frac{1}{L}y - \frac{R_S}{L}x_1 + \frac{u_0}{L} + \frac{y}{L}d$$

$$y = y$$

Linearization about an equilibrium point results in a zero of the transfer function of Eq. 12 in the open left half plane, if the Ridley condition $$R_C C > \frac{1}{R(1 - D)}$$ Eq. 13 is met where D is a duty ratio for the instantaneous equilibrium point ($y = y_0'$ and $x_1 = x_{10}'$) where $y_0'$ and $x_{10}'$ are constants. Set $$d_0(t) = \frac{(R + R_C)LC\dot{y}_0 + (RR_C C + L)y_0 -}{R\left(R_C Cy_0 - \frac{LR}{(R + R_C)}x_1\right)}$$ Eq. 14 where $y_0(t)$, $\dot{y}_0(t)$ are bounded on $[0, \infty)$. Substituting $d_0(t)$ from Eq. 14 and $y = y_0$ into Eq. 12 results in a differential equation for $x_1$ that has an open left half plane zero as the characteristic root of its linear part A sufficient condition that a particular solution $x_{10}(t)$ bounded on $[0, \infty)$ exists is that $y_0(t') = y_0'$ for a fixed time t' and the Ridley condition holds for the fixed time t'.

Implementing a proportional output feedback in the controller with proportional gain $k(y - y_0)$, the duty ratio for the feedback control signal supplied to the boost converter circuit by the controller is:

$$d(t) = \frac{(R + R_C)LC[\dot{y}_0(t) - k(y - y_0(t))] +}{R\left(R_C Cy - \frac{LR}{(R + R_C)}x_1\right)}$$ Eq. 15

In another embodiment, integral and derivative gain can also be used to derive d(t).

When the controller implements Eq. 15, y(t) converges to $y_0(t)$, d(t) converges to a steady-state function $D_0(t)$ as t goes to infinity and steady-state tracking is achieved for the boost inverter. A time varying desired output voltage $y_0(t)$ is easily handled by the controller by utilizing the desired output voltage and its derivative, $y_0(t)$ and $\dot{y}_0(t)$ as shown in Eq. 15, computing d(t) and applying the feedback control signal with d(t) to the voltage converter circuit.

In an alternate embodiment, $u_0$ is a time varying function bounded on $[0,\infty)$ and the equations 12-15 are adjusted accordingly to derive the duty ratio d(t) and produce the desired output voltage $y_0(t)$.

In another alternate embodiment of a boost converter, controller 120 uses TEM with switch-off time sampling of the state variables. The resulting formula for duty ratio d in Eq. 15 is the same as derived for the preferred embodiment of the boost converter.

Figure 5:
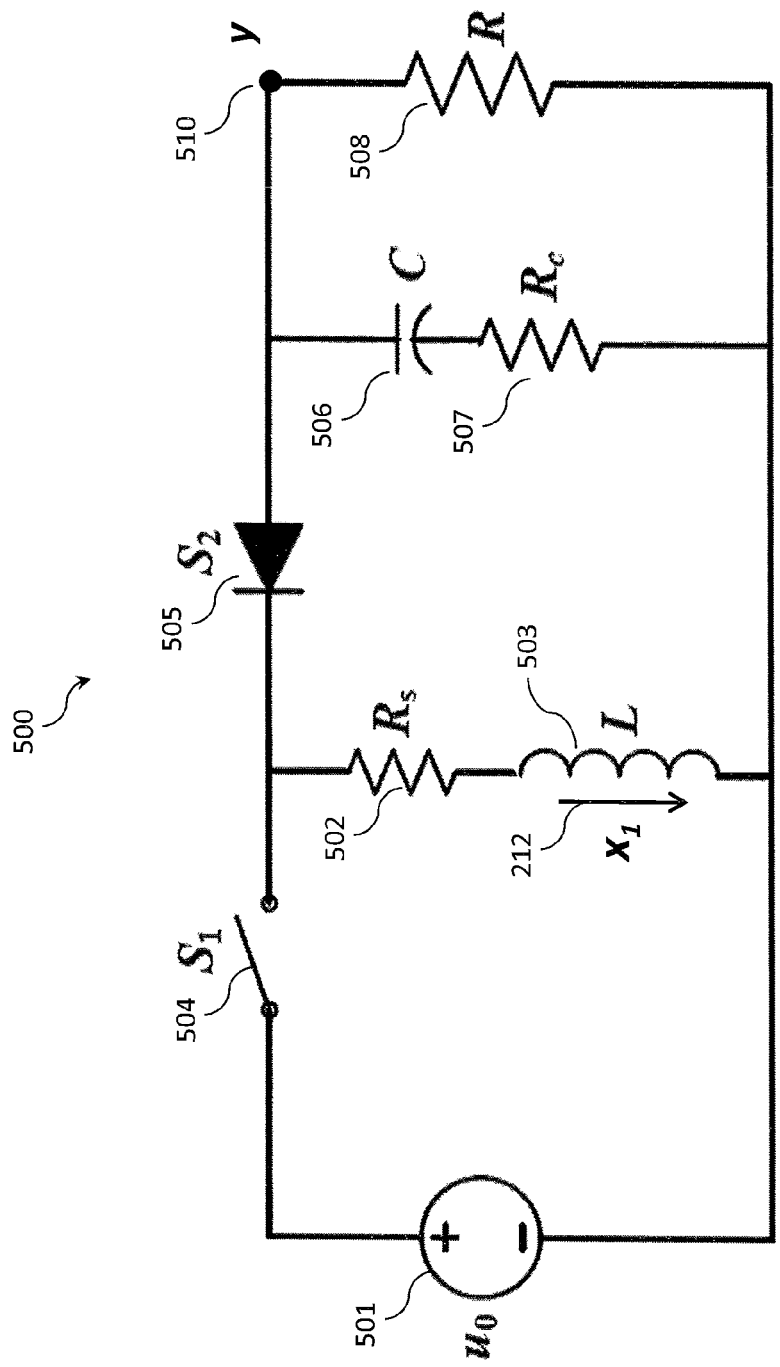
FIG. 5 is a circuit diagram of a buck-boost converter of a preferred embodiment.

FIG. 5 illustrates a preferred embodiment buck-boost converter circuit 500 having a single output voltage 510 (y). The buck-boost converter comprises a switch 504 ($S_1$) connected in series with series resistor 502 ($R_s$) which is further connected to an inductor 503 (L). Inductor 503 and switch 504 are connected to DC voltage input 501 ($u_0$) to complete a series circuit. A capacitive circuit comprises a switch 505 ($S_2$) connected between switch 504 and a capacitor 506 (C), and further connected in series with DC series resistance 507 ($R_C$) associated with capacitor 506. Load resistance 508 (R) is connected in parallel with the capacitor 506 and DC series resistance 507. Output voltage 510 is taken across load resistance 508. The inductor current 512 ($x_1$) is measured as the current through inductor 503 and series resistor 502.

In a preferred embodiment of a buck-boost converter, buck-boost converter circuit 500 is substituted for voltage converter circuit 102, and controller 120 uses LEM with switch off time sampling of the state variables. The DC voltage input $u_0$ is a constant and the desired output voltage $y_0(t)$ is a cosine function. More generally, the desired output voltage $y_0(t)$ is not just a sinusoidal function, but together with its time derivative, are general functions that are bounded on $[0, \infty)$. A switch matrix is employed by the controller to handle the positive, zero, and negative values of $u_0$, $y_0$ and y as required to set the duty ratio.

The state equations for y and $x_1$ for the buck-boost converter under nonlinear Cuk-Middlebrook averaging with LEM and switch-off time sampling are:

$$\dot{y} = \frac{1}{(R+R_C)LC} \begin{bmatrix} -(RR_CC+L)y - (L-R_SR_CC)Rx_1 + \\ RR_CCu_0 + \\ R\left(R_CCy + \frac{LR}{(R+R_C)}x_1 - R_CCu_0\right)d \end{bmatrix} \quad \text{Eq. 16}$$

$$\dot{x}_1 = \frac{1}{L}y - \frac{R_S}{L}x_1 + \frac{u_0}{L} - \frac{y}{L}d$$

$$y = y$$

Linearization about an equilibrium point results in a zero of the transfer function of Eq. 16 in the open left half plane, if the Ridley condition $$R_CC > \frac{LD}{R(1-D)} \quad \text{Eq. 17}$$

is met where D is a duty ratio for the instantaneous equilibrium point ($y=y_0'$ and $x_1=x_{10}'$) where $y_0'$ and $x_{10}'$ are constants. A time-varying duty ratio for the desired output voltage $y_0(t)$ is given by $$d_0(t) = \frac{(R+R_C)LC\dot{y}_0 + (RR_CC+L)y_0 + (L-R_SR_CC)Rx_1}{R\left(R_CCy_0 + \frac{LR}{(R+R_C)}x_1 - R_CCu_0\right)} \quad \text{Eq. 18}$$

for $y_0(t)$, $\dot{y}_0(t)$ bounded on $[0,\infty)$. Substituting $d_0(t)$ from Eq. 18 and $y=y_0$ into Eq. 16 results in a differential equation for $x_1$ that has an open left half plane zero as the characteristic root of its linear part. A sufficient condition that a particular solution $x_{10}(t)$ bounded on $[0,\infty)$ exists is that $y_0(t')=y_0'$ for a fixed time t' and the Ridley condition holds for the fixed time t'.

Implementing a proportional output feedback in the controller with proportional gain k ($y-y_0$), the duty ratio for the feedback control signal supplied to the buck-boost converter circuit by the controller is:

$$d(t) = \frac{(R+R_C)LC[\dot{y}_0(t) - k(y-y_0(t))] +}{R\left(R_CCy + \frac{LR}{(R+R_C)}x_1 - R_CCu_0\right)} \quad \text{Eq. 19}$$

$$\frac{(RR_CC+L)y - (L-R_SR_CC)Rx_1}{}$$

In another embodiment, integral and derivative gain can also be utilized to derive d(t).

When the controller implements Eq. 19, y(t) converges to $y_0(t)$, d(t) converges to a steady-state function $D_0(t)$ as time t goes to infinity and steady-state tracking is achieved for the buck-boost inverter. A time varying desired output voltage $y_0(t)$ is easily handled by the controller by utilizing the desired output voltage and its derivative, $y_0(t)$ and $\dot{y}_0(t)$ as shown in Eq. 19, computing d(t) and applying the feedback control signal with d(t) to the voltage converter circuit.

In an alternate embodiment, $u_0$ is a time varying function bounded on $[0,\infty)$ and the equations 16-19 are adjusted accordingly to derive the duty ratio d(t) and produce the desired output voltage $y_0(t)$.

In another alternate embodiment of a buck-boost converter, controller 120 uses TEM with switch-off time sampling of the state variables. The resulting formula for duty ratio d in Eq. 19 is the same as derived for the preferred embodiment of the buck-boost converter.

In general, for time varying inputs voltage $u_0(t)$, if the input $u_0(t)$ for the buck inverter is a bounded function of time, then the zero of the transfer function remains $-1/(R_CC)$, which is in the open left half plane. The $u_0$ term is cancelled in the ratio $b_2/b_1$ of the zero z in Eq. 3.

The formula for duty ratio d is still given by Eq. 7. In Eq. 5 and Eq. 8, the $u_0$ term is cancelled in the ratio. Thus Eq. 5 and Eq. 8 form a constant coefficient linear ordinary differential equation and a constant coefficient linear first order system, respectively, even if the input voltage $u_0(t)$ is time varying.

A time varying input voltage $u_0(t)$ and time varying desired output $y_0(t)$ are easily handled by simply changing $u_0$, $y_0$, and $\dot{y}_0$ in Eq. 11. If $u_0(t)$ is a sinusoidal wave of a certain frequency and $y_0(t)$ is a sinusoidal wave of an arbitrary and different frequency, then a buck AC-AC inverter is realized with any desired output frequency. This enables an inverter to operate a variable speed single phase motor drive from a standard ac source.

For the boost and the buck-boost, time varying inputs $u_0(t)$ appear to call for time varying Ridley conditions. However, the Ridley condition for the boost and the Ridley condition for the buck-boost do not depend on $u_0(t)$. Hence the general analysis, applied to the buck converter, can be applied to the boost and buck-boost converter. In both the Eq. 15 for the boost and Eq. 19 for the buck-boost, a time varying $u_o(t)$ can be used.

In implementing any of the duty ratio equations the denominator must never be zero and d(t) must be between 0 (zero) and 1 (one). For a time function $y_0(t)$ when there is an equilibrium point for the state equations, the functions $y_0(t)$, $x_{10}(t)$, and $D_0(t)$ play the same role as the constants $y_0$, $x_{10}$, and D when $y_0$ is a constant. For $y_0(t)$ the function $D_0(t)$ is the system inverse if the initial conditions are correct and there are no modeling errors, disturbances, and noise.

For all converters disclosed, $y_0$ being constant is a special case, which is DC-DC conversion. For the buck converter, when input-output linearization is applied for DC-DC conversion, the duty ratio equation becomes $$d = \frac{(RR_CC + L)y - (-RR_SR_CC + LR)x_1 + (R + R_C)LCk(y_0 - y)}{RR_CCu_0}.$$  Eq. 20

For boost and buck-boost inverters, the Ridley condition with LEM is an important requirement.

Figure 6:
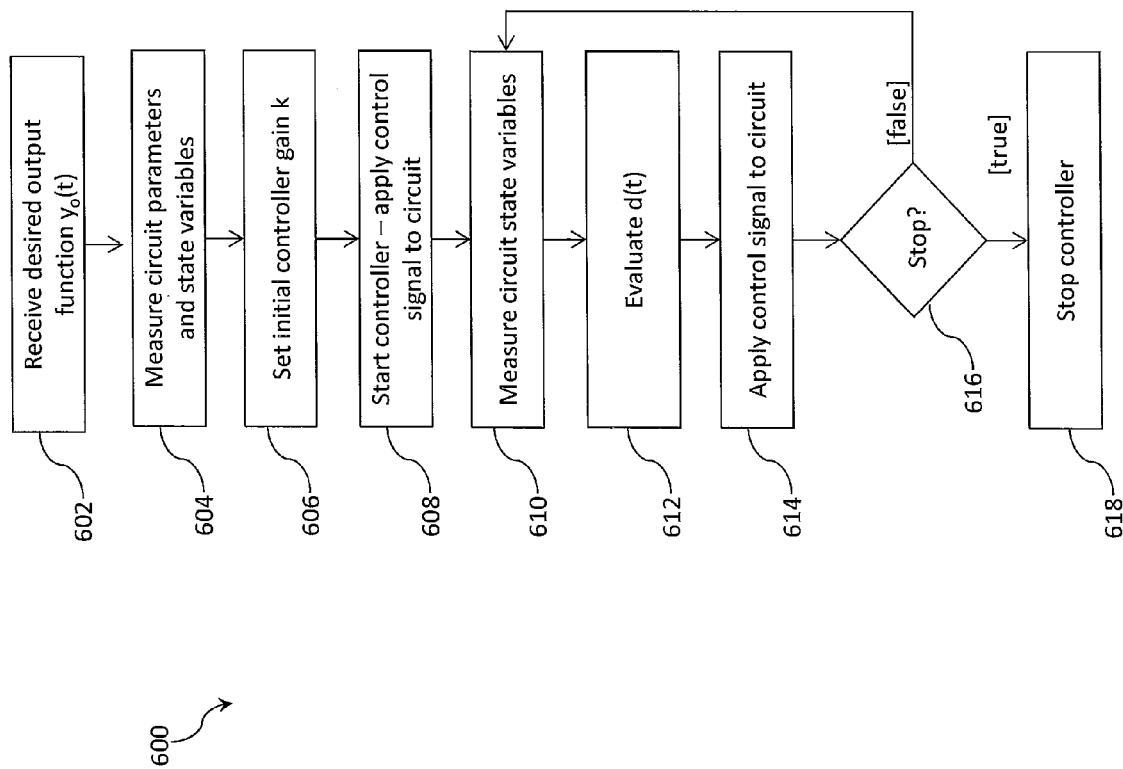
FIG. 6 is a flow chart of a method of operation for a preferred embodiment of a voltage inverter.

Referring to FIG. 6, a method 600 for operation of a voltage inverter is provided. The voltage inverter includes a voltage converter circuit, a controller and a voltage source supplying input voltage $u_0$. The method begins at step 602 where a desired output function $y_0(t)$ is defined and received into the controller. At step 604, a set of circuit parameters for the voltage converter circuit are determined including a load resistance and a set of state variables are measured including the output voltage and the inductor current. At step 606, an initial controller gain k is set to a pre-defined (proportional, integral and derivative) gain value. At step 608, the controller is started, applying the control signal to the voltage converter circuit using the initial duty ratio d and the initial value of desired output voltage $y_0(t)$.

At step 610, the set of circuit parameters and state variables are dynamically measured. At step 612, the duty ratio d is dynamically adjusted based on the set of parameters and the set of state variables, the input voltage $u_0$ and the controller gain factor k. At step 614, the control signal with duty ratio d is applied to the voltage converter circuit. At step 616, a determination of a stop condition is made. If the stop condition is true, then at step 618, the voltage converter is stopped. If the stop condition is false, then the method continues performing steps 610, 612, 614 and 616.

In step 612, if the voltage converter circuit is a buck converter then Eqs. 9-11 are applied to determine the duty ratio d(t).

Further to step 612, if the voltage converter circuit is a boost converter then Eq. 15 is applied to determine the duty ratio d(t).

Further to step 612, if the voltage converter circuit is a buck-boost converter then Eq. 19 is applied to determine the duty ratio d(t).

For inverters with one inductor and n outputs associated with n capacitors, MIMO control methods with n duty ratios can be applied similar to the disclosure in U.S. Patent Application Publication No. 2012/0139509 incorporated herein by reference. MIMO control methods can be applied to the apparatus of the present disclosure to accomplish multiple output inverters with time varying output voltages generated from one or more input voltages.

Figure 7:
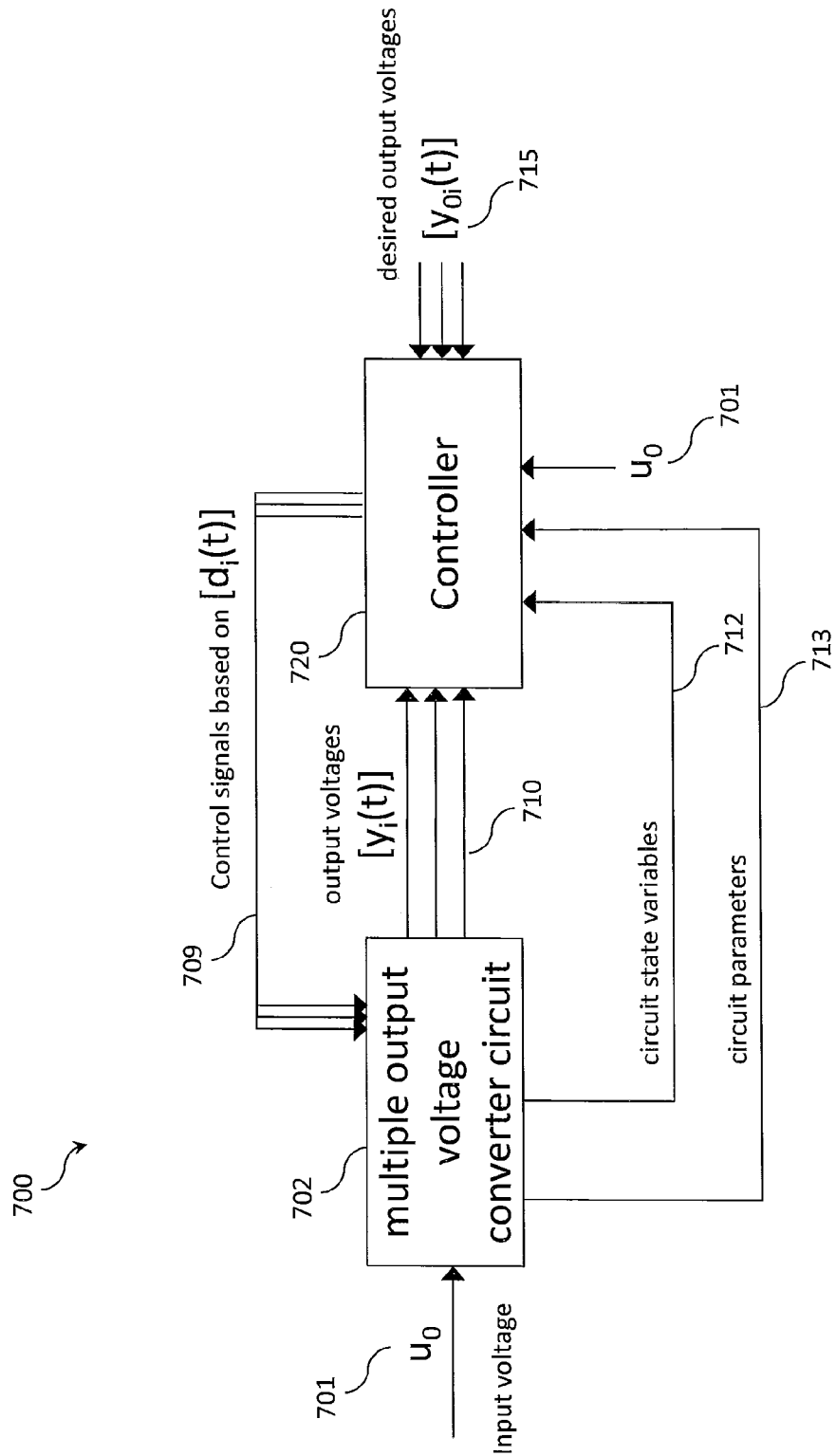
FIG. 7 is a block diagram of a multiple output tracking inverter.

FIG. 7 shows a preferred embodiment of a tracking inverter 700 suitable for controlling a multiple output voltage converter circuit to produce a set of time varying output voltages. Tracking inverter 700 is amenable to input-output linearization methods that do not constrain stability to one operating point, but rather to a set of operating points spanning the expected range of operation during startup and transient modes of operation. A multiple output voltage converter circuit 702 is connected to an input voltage 701 ($u_o$) and produces a set of output voltages 710, [$y_i(t)$], in response to a control signal 709 characterized by a set of duty ratios [$d_i(t)$]. Set of output voltages 710 are time varying waveforms intended to match a set of desired output voltages 715, [$y_{0i}(t)$], also time varying. Controller 720 produces control signal 709 from sensing set of output voltages 710, input voltage 701, set of desired output voltages 715, a set of static circuit parameters 713 including, for example, the load resistances $R_i$, the capacitances $C_i$ and the inductances $L_i$ of the ith stage of the multiple output voltage converter and a set of state variables 712 including, for example, inductor currents $x_{1i}$ and capacitor voltages $x_{2i}$. Control signal 709 determines the states of switch matrix internal to multiple output voltage converter circuit 702.

Controller 720 is preferably implemented in one or more digital devices, implemented with programmable software instructions stored in memory and executed by a processor to carry out the converter control functions including output adjustment. In alternate embodiments, an analog implementation is used instead of a digital implementation. The controller is then implemented as a set of hardware functions, including analog adders and multipliers.

Controller 720 can implement any desired control method. For example, a pulse width modulated (PWM) controller is suitably constructed. The PWM controller produces a time varying control signal which drives the switching of each voltage converter stage in the multiple voltage converter circuit with its corresponding duty ratio.

In any of the embodiments disclosed, the controller is implemented according to one of a group of: a discrete electronics circuit; a set of programmed instructions embodied in an FPGA; a set of programmed instructions embodied in a digital signal processor; a microcontroller; a set of programmed instructions embodied in an ASIC; and combinations thereof. A suitable hardware platform includes clocking circuits, a CPU, a non-volatile memory for storing the programmed instructions, a volatile memory for storing intermediate results and for storing calculated parameters for the controller and suitable input/output controls for starting, stopping and entering parameters related to the function of the controller.

In an embodiment utilizing analog control instead of digital control, the controller is replaced by an analog PID controller with analog inputs for $u_0$, $y_0$, $x_1$, and y. The load resistance R and current $x_1$ is measured and converted to corresponding voltages.

The embodiments presented in this disclosure are intended to provide implementable examples of the present invention, but are not intended to limit the present invention. For instance, the control method provided by input-output feedback linearization using leading edge modulation with switch off time sampling is meant as an example control method. For example, trailing edge modulation with switch off time sampling can be utilized. Generally, the controller can utilize any control method based on many different control theories.

The invention claimed is:

1. A tracking inverter for converting an input voltage to a time-varying output voltage comprising:

a voltage converter circuit comprising an inductor, powered by the input voltage and producing an inductor current through the inductor;

a predetermined output voltage that varies with time;

a controller, connected to the voltage converter circuit, configured to apply a control signal to the voltage converter circuit;

the control signal having a duty ratio based on the predetermined output voltage, the time-varying output voltage, the input voltage, a gain factor and the inductor current;

whereby the voltage converter circuit generates the time-varying output voltage to match the predetermined output voltage; and, wherein:

the voltage converter circuit is characterized by a set of circuit parameters;

the duty ratio is given by $$d(t) = \frac{\dot{y}_0 - k(y - y_0) - a_{11}y - a_{12}x_1}{b_1};$$

and, $y_0$ is the predetermined output voltage, $\dot{y}_0$ is time derivative of $y_0$, y is the time varying-output voltage, k is the gain factor, $x_1$ is the inductor current and the variables $a_{11}$, $a_{12}$ and $b_1$ are derived from the set of circuit parameters and the input voltage.

2. The tracking inverter of claim 1 wherein the controller is configured to generate the control signal for leading edge modulation.

3. The tracking inverter of claim 1 wherein the controller is configured to generate the control signal based on input-output feedback linearization of a set of state variables with stable zero dynamics.

4. The tracking inverter of claim 1 wherein the gain factor includes at least one of the group consisting of a proportional gain, an integral gain and a derivative gain.

5. The tracking inverter of claim 1 wherein the predetermined output voltage varies sinusoidally in time.

6. The tracking inverter of claim 1 wherein the input voltage varies in time with a first waveform and the time-varying output voltage varies in time with a second waveform different than the first waveform.

7. The tracking inverter of claim 1 wherein the input voltage is sinusoidal at a first frequency and the time-varying output voltage is sinusoidal at a second frequency different than the first frequency.

8. The tracking inverter of claim 1 wherein the input voltage has a first frequency spectrum and the predetermine output voltage has a second frequency spectrum different than the first frequency spectrum.

9. The tracking inverter of claim 1 wherein the voltage converter circuit comprises a buck converter circuit.

10. The tracking inverter of claim 1 wherein:

the voltage converter circuit comprises a buck converter circuit;

the buck converter circuit further comprises the inductor connected in series with a load resistance, the input voltage and a switch;

a capacitor is connected in parallel with the load resistance;

$$a_{11} = -\frac{R_C R}{R + R_C}\left(\frac{1}{L} + \frac{1}{RR_C C}\right);$$

$$a_{12} = \frac{R_C R}{R + R_C}\left(-\frac{R_S}{L} + \frac{1}{R_C C}\right);$$

$$b_1 = \frac{R_C R u_0}{(R + R_C)L};$$

and, C is the capacitance value of the capacitor, $R_C$ is the series capacitive resistance of the capacitor, R is the value of the load resistance, L is the inductance value of the inductor, $R_S$ is the series resistance of the inductor and $u_0$ is the input voltage.

11. The tracking inverter of claim 1 wherein the voltage converter circuit comprises a boost converter circuit.

12. The tracking inverter of claim 1 wherein the voltage converter circuit comprises a buck-boost converter circuit.

13. A tracking inverter for converting an input voltage to a time-varying output voltage comprising:

a voltage converter circuit comprising an inductor, powered by the input voltage and producing an inductor current through the inductor;

a predetermined output voltage that varies with time;

a controller, connected to the voltage converter circuit, configured to apply a control signal to the voltage converter circuit;

the control signal having a duty ratio based on the predetermined output voltage, the time-varying output voltage, the input voltage, a gain factor and the inductor current;

whereby the voltage converter circuit generates the time-varying output voltage to match the predetermined output voltage;

wherein the voltage converter circuit comprises a boost converter circuit;

wherein:

the boost converter circuit further comprises the inductor switchably connected in series with a load resistance and the input voltage;

a capacitor is connected in parallel with the load resistance;

the duty ratio is given by $$d(t) = \frac{(R+R_C)LC[\dot{y}_0(t) - k(y - y_0(t))] + (RR_C C + L)y - (L - R_S R_C C)Rx_1 - RR_C C u_0}{R\left(R_C C y - \frac{LR}{(R+R_C)}x_1\right)};$$

wherein C is the capacitance value of the capacitor, $R_C$ is the series capacitive resistance of the capacitor, R is the value of the load resistance, L is the inductance value of the inductor, $R_S$ is the series resistance of the inductor and $u_0$ is the input voltage; and, wherein $y_0$ is the predetermined output voltage, $\dot{y}_0$ is time derivative of $y_0$, y is the time varying-output voltage, k is the gain factor and $x_1$ is the inductor current.

14. A tracking inverter for converting an input voltage to a time-varying output voltage comprising:

a voltage converter circuit comprising an inductor, powered by the input voltage and producing an inductor current through the inductor;

a predetermined output voltage that varies with time;

a controller, connected to the voltage converter circuit, configured to apply a control signal to the voltage converter circuit;

the control signal having a duty ratio based on the predetermined output voltage, the time-varying output voltage, the input voltage, a gain factor and the inductor current;

whereby the voltage converter circuit generates the time-varying output voltage to match the predetermined output voltage;

wherein the voltage converter circuit comprises a buck-boost converter circuit;

wherein:
the buck-boost converter circuit further comprises the inductor switchably connected in series with a load resistance;
the input voltage is switchably connected in parallel with the inductor;
a capacitor is connected in parallel with the load resistance;
the duty ratio is given by $$d(t) = \frac{(R+R_C)LC[\dot{y}_0(t)-k(y-y_0(t))] + (RR_CC+L)y - (L-R_SR_CC)Rx_1}{R\left(R_CCy + \frac{LR}{(R+R_C)}x_1 - R_CCu_0\right)};$$

wherein C is the capacitance value of the capacitor, $R_C$ is the series capacitive resistance of the capacitor, R is the value of the load resistance, L is the inductance value of the inductor, $R_S$ is the series resistance of the inductor and $u_0$ is the input voltage; and, wherein $y_0$ is the predetermined output voltage, $\dot{y}_0$ is time derivative of $y_0$, y is the time varying-output voltage, k is the gain factor and $x_1$ is the inductor current.

15. A method of converting an input voltage into a time-varying output voltage comprising:
providing a voltage converter circuit;
powering the voltage converter circuit with the input voltage;
producing an inductor current through an inductor in the voltage converter circuit;
defining a predetermined output voltage that varies with time;
applying a control signal to the voltage converter circuit;
determining a duty ratio of the control signal based on the predetermined output voltage, the time-varying output voltage, the input voltage, a gain factor and the inductor current;
generating the time-varying output voltage to match the predetermined output voltage;
measuring a set of circuit parameters for the voltage converter circuit; and,
determining the duty ratio according to the formula $$d(t) = \frac{\dot{y}_0 - k(y-y_0) - a_{11}y - a_{12}x_1}{b_1};$$

where $y_0$ is the predetermined output voltage, $\dot{y}_0$ is time derivative of $y_0$, y is the time varying-output voltage, k is the gain factor, $x_1$ is the inductor current and the variables $a_{11}$, $a_{12}$ and $b_1$ are derived from the set of circuit parameters and the input voltage.

16. The method of claim 15 further comprising the step of determining the duty ratio of the control signal based on leading edge modulation.

17. The method of claim 15 further comprising the step of determining the duty ratio of the control signal based on input-output feedback linearization of a set of state variables with stable zero dynamics.

18. The method of claim 15 further comprising the step of determining the gain factor from at least one of the group consisting of a proportional gain, an integral gain and a derivative gain.

19. The method of claim 15 further comprising the step of defining the predetermined output voltage to be a sinusoidal function of time.

20. The method of claim 15 further comprising the steps of:
powering the voltage converter circuit with the input voltage that varies in time with a first waveform;
producing the time-varying output voltage that varies in time with a second waveform different than the first waveform.

21. The method of claim 15 further comprising the steps of:
powering the voltage converter circuit with the input voltage that varies sinusoidally with time at a first frequency; and,
producing the time-varying output voltage that varies sinusoidally with time at a second frequency different than the first frequency.

22. The method of claim 15 further comprising the steps of:
powering the voltage converter circuit with the input voltage that has a first frequency spectrum; and,
producing the time-varying output voltage that has a second frequency spectrum different than the first frequency spectrum.

23. The method of claim 15 further comprising the step of providing a buck converter circuit for the voltage converter circuit.

24. The method of claim 15 further comprising the step of providing a boost converter circuit for the voltage converter circuit.

25. The method of claim 15 further comprising the step of providing a buck-boost converter circuit for the voltage converter circuit.

26. The method of claim 15 further comprising:
measuring a set of circuit parameters for the voltage converter circuit;
determining the gain factor based on the set of circuit parameters;
applying the control signal with the duty ratio to the voltage converter circuit;
adjusting the duty ratio of the control signal based on the set of circuit parameters, the predetermined output voltage, the time-varying output voltage, the input voltage, the gain factor and the inductor current; and,
stopping the method if a directive to stop the controller is received.

27. The method of claim 15 further comprising the steps of:
providing a multiple output voltage converter circuit;
defining a plurality of predetermined output voltages;
defining a plurality of control signals with a plurality of duty ratios and a plurality of gain factors;
applying the plurality of control signals to the multiple output voltage converter circuit;
generating a plurality of time-varying output voltages from the input voltage to match the plurality of predetermined output voltages.

28. A method of converting an input voltage into a time-varying output voltage comprising:
providing a voltage converter circuit;
powering the voltage converter circuit with the input voltage;

producing an inductor current through an inductor in the voltage converter circuit;
defining a predetermined output voltage that varies with time;
applying a control signal to the voltage converter circuit;
determining a duty ratio of the control signal based on the predetermined output voltage, the time-varying output voltage, the input voltage, a gain factor and the inductor current;
generating the time-varying output voltage to match the predetermined output voltage;
providing a buck converter circuit for the voltage converter circuit wherein the buck converter circuit comprises the inductor connected in series with a load resistance, the input voltage and a switch, and, a capacitor connected in parallel with the load resistance;
determining the duty ratio according to the formula $$d(t) = \frac{\dot{y}_0 - k(y - y_0) - a_{11}y - a_{12}x_1}{b_1};$$

for which $$a_{11} = -\frac{R_C R}{R + R_C}\left(\frac{1}{L} + \frac{1}{RR_C C}\right);$$

$$a_{12} = \frac{R_C R}{R + R_C}\left(-\frac{R_S}{L} + \frac{1}{R_C C}\right);$$

$$b_1 = \frac{R_C R u_0}{(R + R_C)L};$$

wherein $y_0$ is the predetermined output voltage, $\dot{y}_0$ is time derivative of $y_0$, y is the time varying-output voltage, k is the gain factor, and $x_1$ is the inductor current; and,
wherein C is the capacitance value of the capacitor, $R_C$ is the series capacitive resistance of the capacitor, R is the value of the load resistance, L is the inductance value of the inductor, $R_S$ is the series resistance of the inductor and $u_0$ is the input voltage.

29. A method of converting an input voltage into a time-varying output voltage comprising:
providing a voltage converter circuit;
powering the voltage converter circuit with the input voltage;
producing an inductor current through an inductor in the voltage converter circuit;
defining a predetermined output voltage that varies with time;
applying a control signal to the voltage converter circuit;
determining a duty ratio of the control signal based on the predetermined output voltage, the time-varying output voltage, the input voltage, a gain factor and the inductor current;
generating the time-varying output voltage to match the predetermined output voltage;
providing a boost converter circuit for the voltage converter circuit, wherein the boost converter circuit comprises the inductor switchably connected in series with a load resistance and the input voltage, and, a capacitor connected in parallel with the load resistance;
defining the duty ratio according to the formula $$d(t) = \frac{(R + R_C)LC[\dot{y}_0(t) - k(y - y_0(t))] + (RR_C C + L)y - (L - R_S R_C C)Rx_1 - RR_C Cu_0}{R\left(R_C Cy - \frac{LR}{(R + R_C)}x_1\right)};$$

wherein $y_0$ is the predetermined output voltage, $\dot{y}_0$ is time derivative of $y_0$, y is the time varying-output voltage, k is the gain factor and $x_1$ is the inductor current; and,
wherein C is the capacitance value of the capacitor, $R_C$ is the series capacitive resistance of the capacitor, R is the value of the load resistance, L is the inductance value of the inductor, $R_S$ is the series resistance of the inductor and $u_0$ is the input voltage.

30. A method of converting an input voltage into a time-varying output voltage comprising:
providing a voltage converter circuit;
powering the voltage converter circuit with the input voltage;
producing an inductor current through an inductor in the voltage converter circuit;
defining a predetermined output voltage that varies with time;
applying a control signal to the voltage converter circuit;
determining a duty ratio of the control signal based on the predetermined output voltage, the time-varying output voltage, the input voltage, a gain factor and the inductor current;
generating the time-varying output voltage to match the predetermined output voltage;
providing a buck-boost converter circuit for the voltage converter circuit, wherein the buck-boost converter comprises the inductor switchably connected in series with a load resistance, the input voltage switchably connected in parallel with the inductor, and, a capacitor connected in parallel with the load resistance;
defining the duty ratio according to the formula $$d(t) = \frac{(R + R_C)LC[\dot{y}_0(t) - k(y - y_0(t))] + (RR_C C + L)y - (L - R_S R_C C)Rx_1}{R\left(R_C Cy + \frac{LR}{(R + R_C)}x_1 - R_C Cu_0\right)};$$

wherein $y_0$ is the predetermined output voltage, $\dot{y}_0$ is time derivative of $y_0$, y is the time varying-output voltage, k is the gain factor and $x_1$ is the inductor current; and,
wherein C is the capacitance value of the capacitor, $R_C$ is the series capacitive resistance of the capacitor, R is the value of the load resistance, L is the inductance value of the inductor, $R_S$ is the series resistance of the inductor and $u_0$ is the input voltage.

* * * * *